US012641957B2

(12) United States Patent
Lee et al.

(10) Patent No.: US 12,641,957 B2
(45) Date of Patent: May 26, 2026

(54) DISPLAY DEVICE AND METHOD OF PROVIDING THE SAME

(71) Applicant: Samsung Display Co., LTD., Yongin-si (KR)

(72) Inventors: Kyong-Chol Lee, Yongin-si (KR); Yunjong Yeo, Yongin-si (KR); Taesung Kim, Yongin-si (KR); Hyunmin Cho, Yongin-si (KR); Yeonhong Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 546 days.

(21) Appl. No.: 18/188,952

(22) Filed: Mar. 23, 2023

(65) Prior Publication Data

US 2024/0074234 A1 Feb. 29, 2024

(30) Foreign Application Priority Data

Aug. 24, 2022 (KR) ........................ 10-2022-0106079

(51) Int. Cl.
| | |
|---|---|
| *H10K 59/121* | (2023.01) |
| *H01L 29/423* | (2006.01) |
| *H01L 29/66* | (2006.01) |
| *H01L 29/786* | (2006.01) |
| *H10D 30/01* | (2025.01) |

(Continued)

(52) U.S. Cl.
CPC ....... *H10K 59/1213* (2023.02); *H10D 30/031* (2025.01); *H10D 30/673* (2025.01); *H10D 30/6736* (2025.01); *H10D 30/6755* (2025.01); *H10D 86/0221* (2025.01); *H10D 86/423*

(2025.01); *H10D 86/431* (2025.01); *H10D 86/60* (2025.01); *H10K 59/1201* (2023.02); *H10K 71/00* (2023.02)

(58) Field of Classification Search
CPC ........... H10K 59/1213; H10D 30/6736; H10D 30/6755; H10D 86/423; H10D 86/431
See application file for complete search history.

(56) References Cited

U.S. PATENT DOCUMENTS

| | | | | |
|---|---|---|---|---|
| 2009/0283763 A1* | 11/2009 | Park | ...................... | H10D 86/60 |
| | | | | 257/E29.296 |
| 2018/0040639 A1* | 2/2018 | Lee | ...................... | H10D 86/431 |
| 2022/0181418 A1* | 6/2022 | Huang | ................. | H10D 86/423 |

FOREIGN PATENT DOCUMENTS

| | | |
|---|---|---|
| JP | 2021192406 A | 12/2021 |
| KR | 1020200019308 A | 2/2020 |
| KR | 102142483 B1 | 8/2020 |

* cited by examiner

*Primary Examiner* — Victoria K. Hall
(74) *Attorney, Agent, or Firm* — CANTOR COLBURN LLP

(57) ABSTRACT

A display device includes a first transistor including a first active pattern including a first oxide semiconductor, and a first gate electrode which is on the first active pattern, a second transistor including a second active pattern including a second oxide semiconductor different from the first oxide semiconductor, and a second gate electrode which is on the second active pattern, a first gate insulating pattern between the second active pattern and the second gate electrode, a second gate insulating pattern facing the first gate insulating pattern with the second active pattern therebetween, and a third gate insulating pattern between the first active pattern and the first gate electrode, the third gate insulating pattern directly contacting the first active pattern and the first gate electrode.

13 Claims, 18 Drawing Sheets

(51) Int. Cl.

| | |
|---|---|
| *H10D 30/67* | (2025.01) |
| *H10D 86/01* | (2025.01) |
| *H10D 86/40* | (2025.01) |
| *H10D 86/60* | (2025.01) |
| *H10K 59/12* | (2023.01) |
| *H10K 71/00* | (2023.01) |

F I G. 3
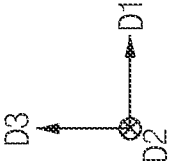

F I G.  5
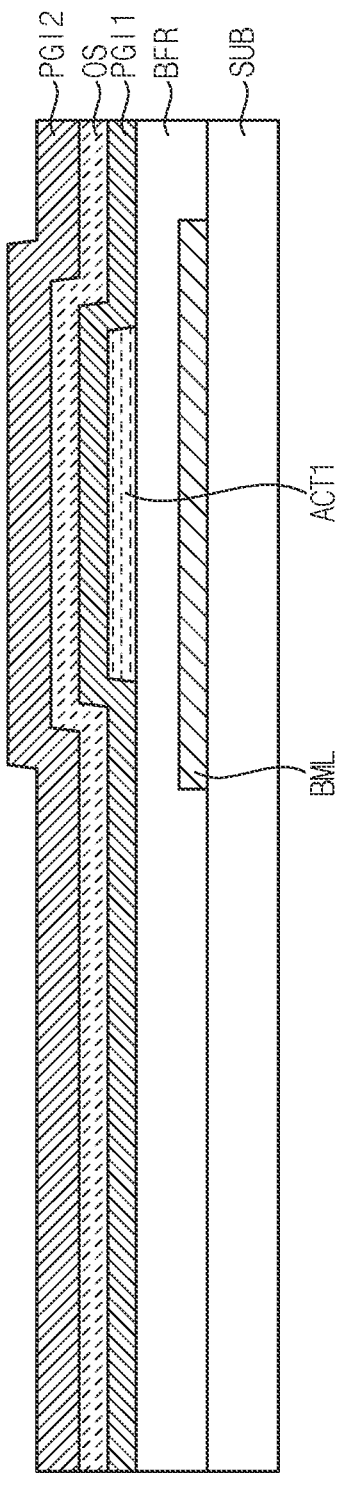
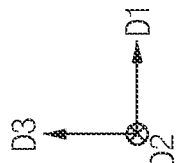

F I G.  6

1st ETCH

PGI2
OS
PGI1
BFR
SUB

PR1

ACT1

BML

D1
D3
D2

FIG. 7
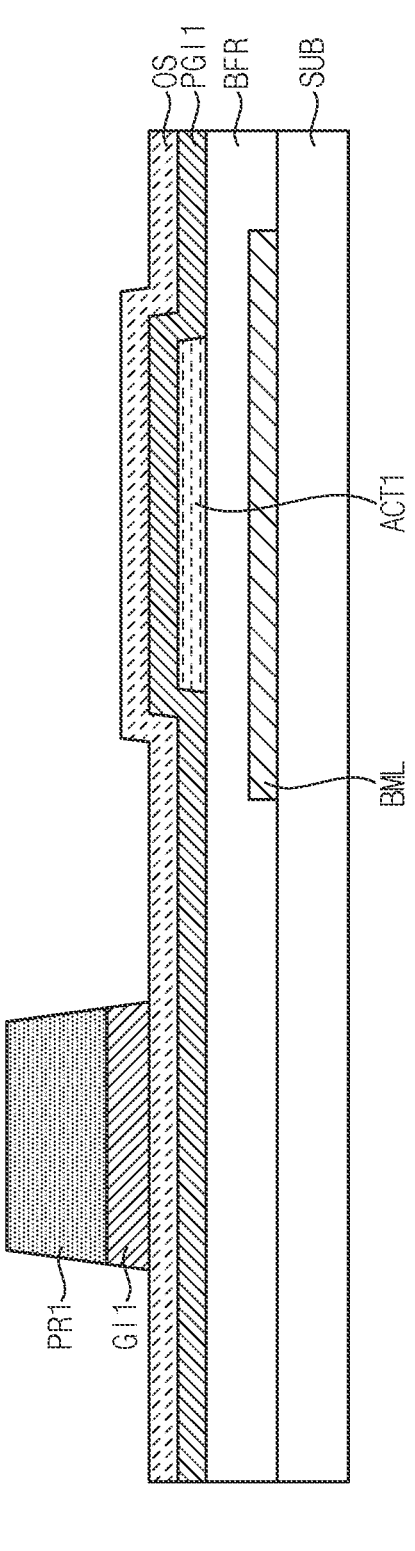
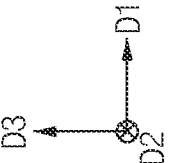

FIG. 9
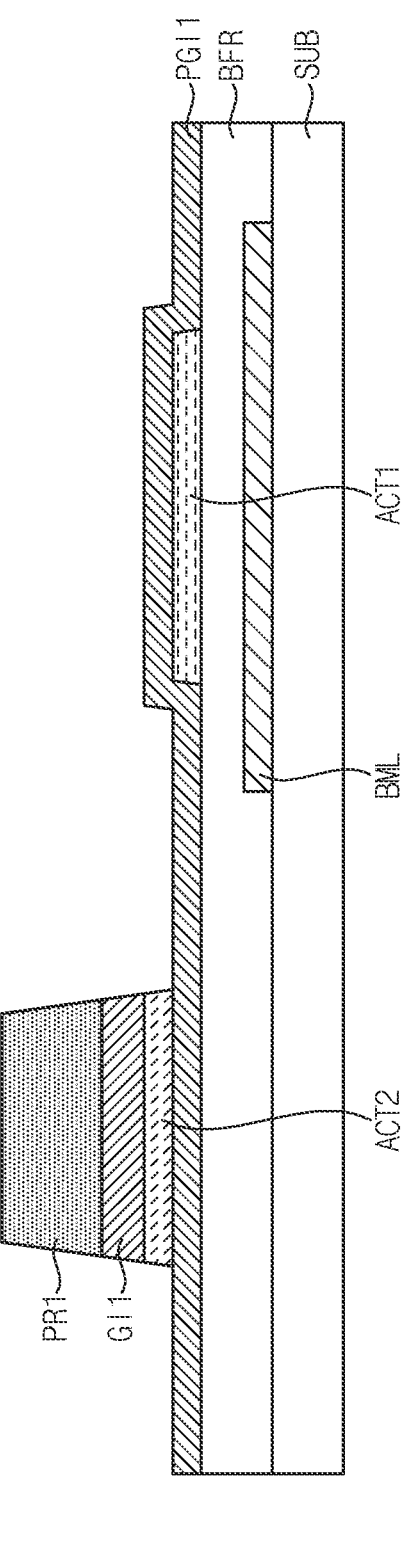
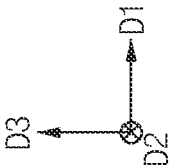

F I G . 12
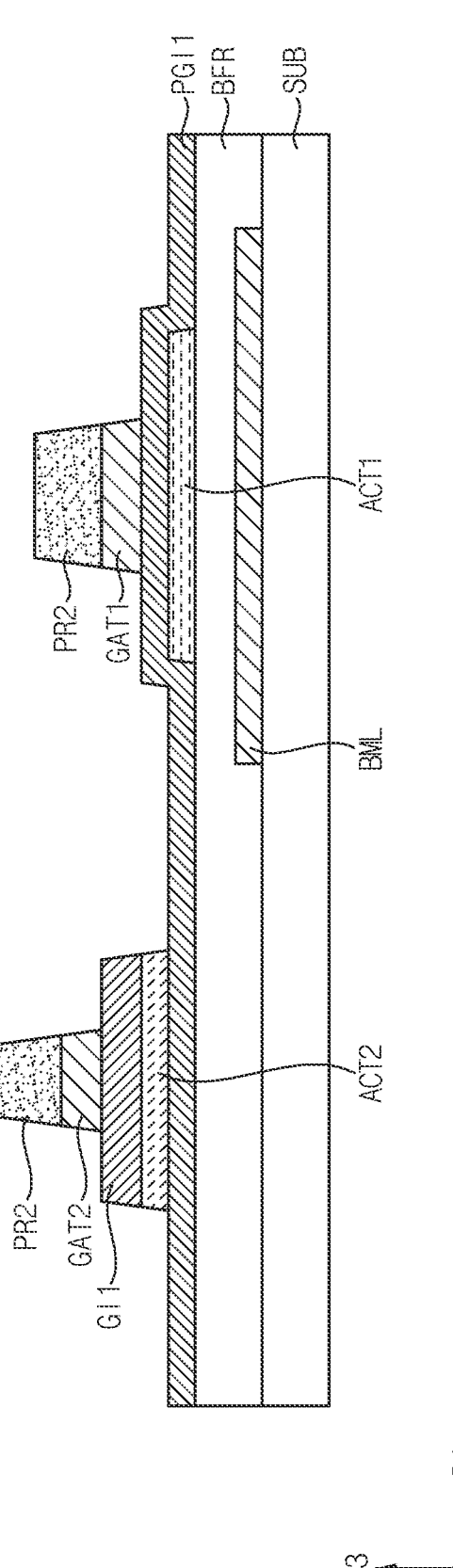

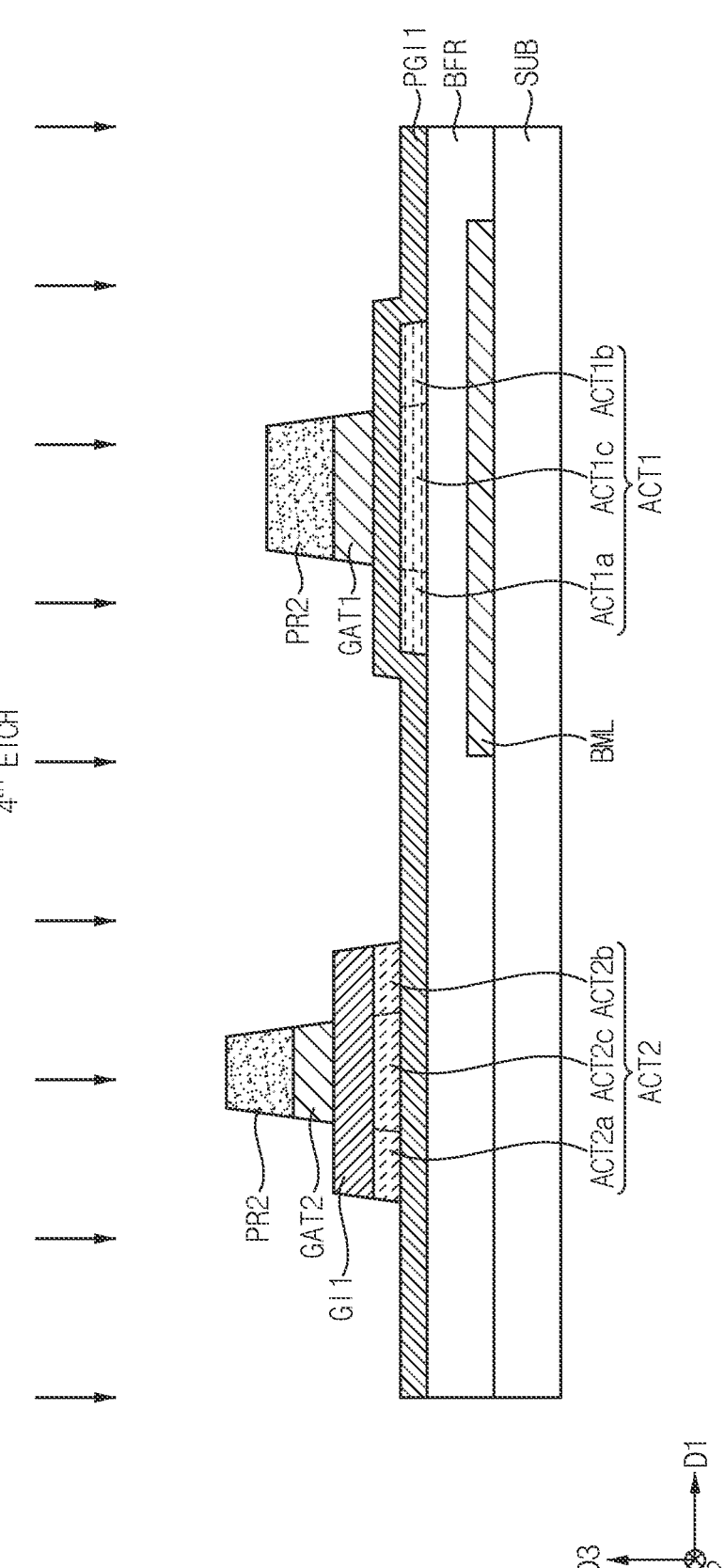
F I G . 13

F I G . 1 4
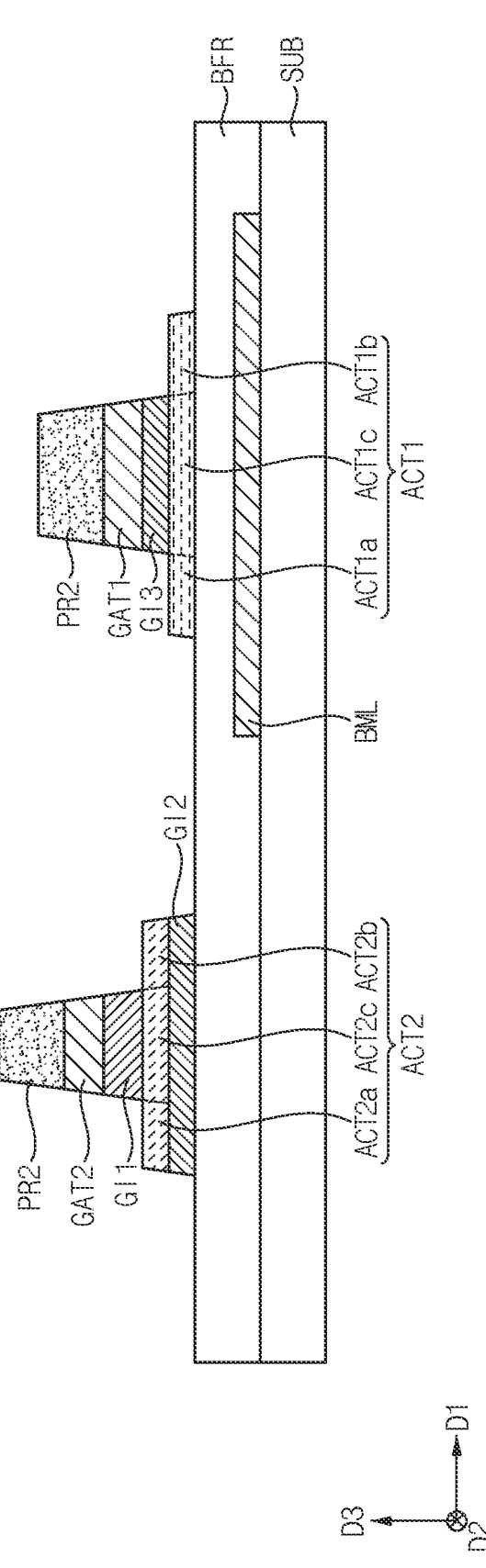

F I G . 1 5
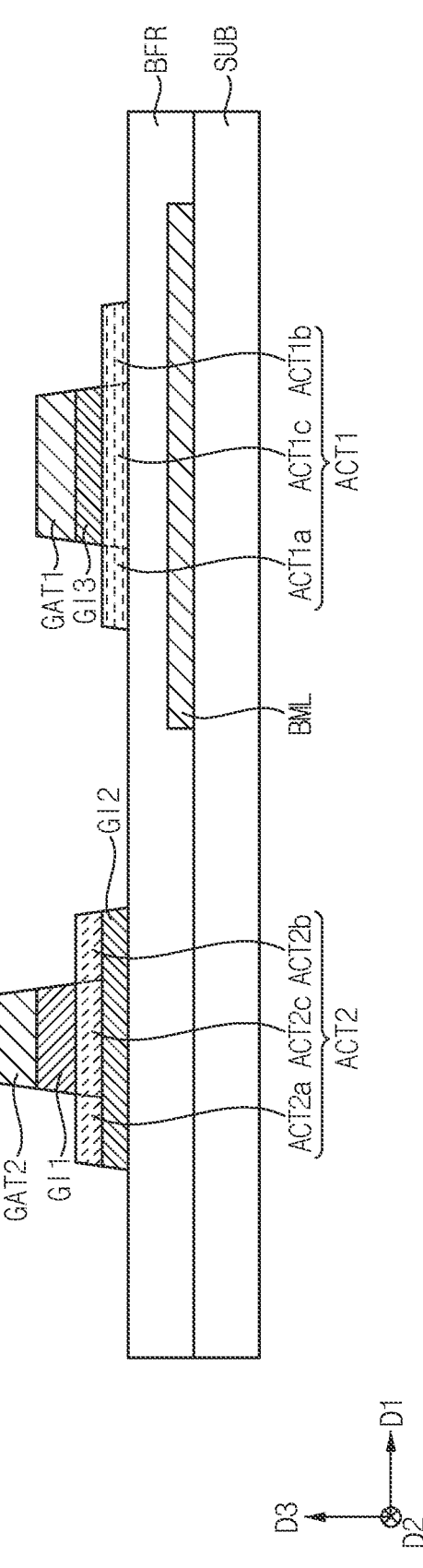

DISPLAY DEVICE AND METHOD OF PROVIDING THE SAME

This application claims priority to Korean Patent Application No. 10-2022-0106079, filed on Aug. 24, 2022, and all the benefits accruing therefrom under 35 U.S.C. § 119, the content of which in its entirety is herein incorporated by reference.

BACKGROUND

1. Field

Embodiments of the invention relate to a display device and method of manufacturing (or providing) the display device.

2. Description of the Related Art

A display device is divided into a display area and a peripheral area. A pixel is disposed in the display area, and a driver, wiring, etc. for driving the pixel is disposed in the peripheral area. The pixel may include a driving device (e.g., a transistor) and a light emitting device (e.g., an organic light emitting diode). The light emitting device may emit light by receiving a signal and/or voltage as an electrical signal from the driving device.

SUMMARY

Embodiments provide a display device with improved reliability.

Embodiments provide a method for manufacturing (or providing) a display device with improved reliability.

A display device according to an embodiment includes a substrate, a first transistor disposed on the substrate and including a first active pattern including a first oxide semiconductor and a first gate electrode disposed on the first active pattern, a second transistor disposed on the substrate and including a second active pattern including a second oxide semiconductor different from the first oxide semiconductor and a second gate electrode disposed on the second active pattern, a first gate insulating pattern disposed between the second active pattern and the second gate electrode, a second gate insulating pattern disposed under the second active pattern, and a third gate insulating pattern disposed between the first active pattern and the first gate electrode and directly contacting the first active pattern and the first gate electrode.

In an embodiment, the first gate insulating pattern may be spaced apart from the first active pattern.

In an embodiment, the second gate insulating pattern and the third gate insulating pattern may include the same material.

In an embodiment, the first gate electrode and the second gate electrode may include the same material.

In an embodiment, the second oxide semiconductor may include tin (Sn).

In an embodiment, the second oxide semiconductor may include at least one selected from the group consisting of tin oxide (SnOx), indium-tin oxide (ITO), zinc-tin oxide (ZTO), indium-zinc-tin oxide (IZTO), tin-aluminum-zinc oxide (TAZO), indium-gallium-tin oxide (IGTO), and indium-tin-gallium-zinc oxide (ITGZO).

In an embodiment, the first oxide semiconductor may include at least one selected from the group consisting of zinc oxide (ZnOx), gallium oxide (GaOx), titanium oxide (TiOx), indium oxide (InOx), indium-gallium oxide (IGO), indium-zinc oxide (IZO), gallium-zinc oxide (GZO), zinc-magnesium oxide (ZMO), zinc-zirconium oxide (ZnZrxOy), indium-gallium-zinc oxide (IGZO) and indium-gallium-hafnium oxide (IGHO).

A method of manufacturing (or providing) a display device according to an embodiment includes forming (or providing) a first active pattern including a first oxide semiconductor on a substrate, forming a first preliminary gate insulating film on the substrate to cover the first active pattern, forming an oxide semiconductor film including a second oxide semiconductor different from the first oxide semiconductor on the first preliminary gate insulating film, forming a second preliminary gate insulating film on the oxide semiconductor film, forming a first gate insulating pattern covering a portion of the oxide semiconductor film by removing a portion of the second preliminary gate insulating film, forming a second active pattern including the second oxide semiconductor by removing the oxide semiconductor film exposed from the second gate insulating pattern, forming a preliminary gate electrode film on the first preliminary gate insulating film to cover the first gate insulating pattern and the second active pattern, forming a first gate electrode disposed on the first active pattern and a second gate electrode disposed on the second active pattern by removing a portion of the preliminary gate electrode film, and forming a second gate insulating pattern disposed under the second active pattern and a third gate insulating pattern disposed between the first active pattern and the first gate electrode by removing a portion of the first preliminary gate insulating film.

In an embodiment, the third gate insulating pattern may be formed to directly contact the first active pattern and the first gate electrode.

In an embodiment, the first gate insulating pattern may be formed to be spaced apart from the first active pattern.

In an embodiment, forming the first gate insulating pattern may include forming a first photoresist pattern on the second preliminary gate insulating film and etching the second preliminary gate insulating film using the first photoresist pattern as a mask.

In an embodiment, the second active pattern may be formed by etching the oxide semiconductor film using the first photoresist pattern and the first gate insulating pattern as a mask.

In an embodiment, the etching of the second preliminary gate insulating film may be performed by dry etching, and the etching of the oxide semiconductor film may be performed by wet etching.

In an embodiment, forming the first gate electrode and the second gate electrode may include forming a second photoresist pattern on the preliminary gate electrode film, and etching the preliminary gate electrode film using the second photoresist pattern as a mask.

In an embodiment, the second gate insulating pattern and the third gate insulating pattern may be formed by etching the first preliminary gate insulating film using the second photoresist pattern, the first gate electrode, the first gate insulating pattern, and the second active pattern as a mask.

In an embodiment, a portion of the first gate insulating pattern may be etched along with the first preliminary gate insulating film.

In an embodiment, a portion of the second active pattern may be exposed from the first gate insulating pattern after a portion of the first gate insulating pattern is etched. In an embodiment, the second oxide semiconductor may include tin (Sn).

In an embodiment, the second oxide semiconductor may include at least one selected from the group consisting of tin oxide (SnOx), indium-tin oxide (ITO), zinc-tin oxide (ZTO), indium-zinc-tin oxide (IZTO), tin-aluminum-zinc oxide (TAZO), indium-gallium-tin oxide (IGTO), and indium-tin-gallium-zinc oxide (ITGZO).

In an embodiment, the first oxide semiconductor may include at least one selected from the group consisting of zinc oxide (ZnOx), gallium oxide (GaOx), titanium oxide (TiOx), indium oxide (InOx), indium-gallium oxide (IGO), indium-zinc oxide (IZO), gallium-zinc oxide (GZO), zinc-magnesium oxide (ZMO), zinc-zirconium oxide (ZnZrxOy), indium-gallium-zinc oxide (IGZO) and indium-gallium-hafnium oxide (IGHO).

The display device according to embodiments may include a first transistor and a second transistor. The first transistor may include a first active pattern including a first oxide semiconductor, and the second transistor may include a second active pattern including a second oxide semiconductor different from the first oxide semiconductor. Accordingly, the first transistor and the second transistor may have different electron mobilities. Accordingly, a display quality of the display device may be improved.

In addition, the first transistor may include a first gate electrode disposed on the first active pattern, and a gate insulating pattern may be disposed between the first active pattern and the first gate electrode. In this case, the gate insulating pattern may directly contact the first active pattern and the first gate electrode. In other words, only the single gate insulating pattern may be disposed between the first active pattern and the first gate electrode. Accordingly, a distance between the first active pattern and the first gate electrode may be shortened. Accordingly, the efficiency of the first transistor may be improved. Accordingly, the light emitting efficiency of the display device may be improved.

In addition, according to the method of manufacturing (or providing) the display device according to embodiments, the process of forming the second gate insulating pattern and the third gate insulating pattern, and the process of forming the first gate insulating pattern, may be performed as separate etching processes. Accordingly, a total thickness of preliminary gate insulating film to be removed for each etching process may be reduced. Accordingly, a damage to the first active pattern and the second active pattern due to the etching process may be minimized. Accordingly, a reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 3 is a cross-sectional view illustrating the display device of FIG. 1, according to an embodiment.

FIGS. 4 to 18 are cross-sectional views illustrating a method of manufacturing (or providing) the display device of FIG. 1, according to an embodiment.

DETAILED DESCRIPTION

Figure 1:
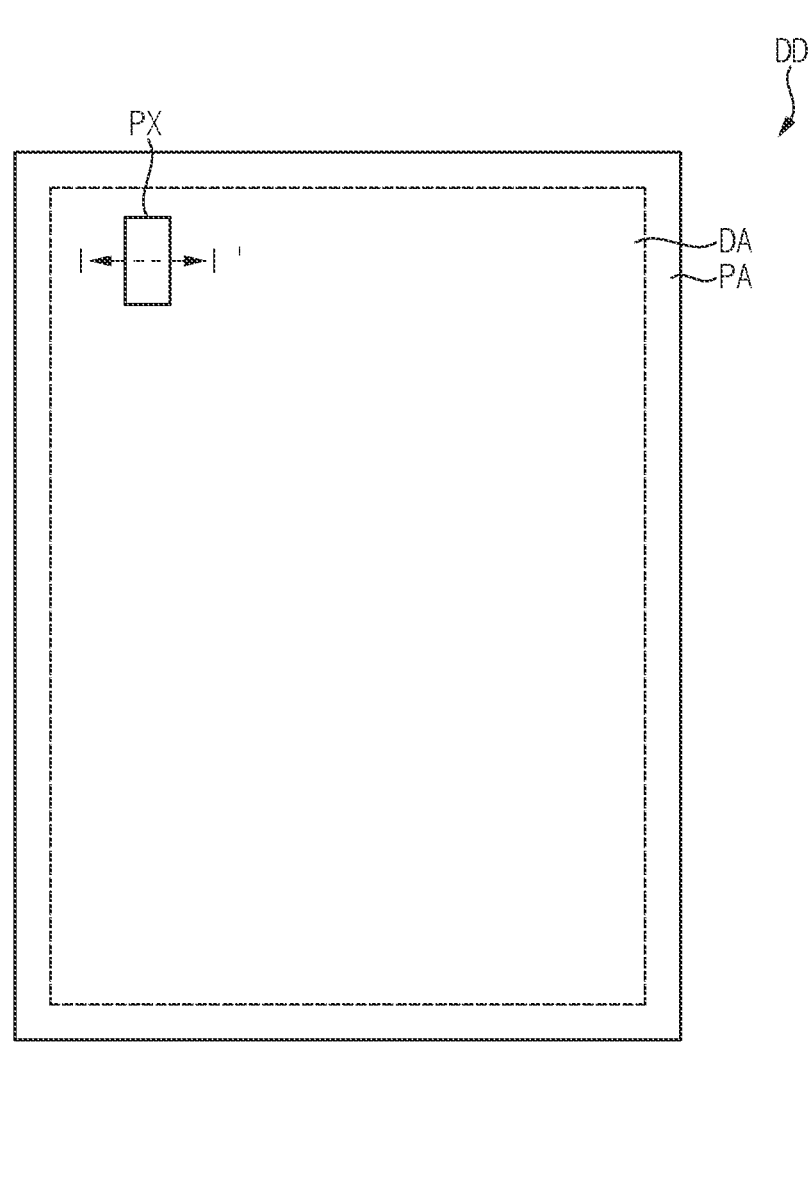
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device DD according to an embodiment of the invention.

Referring to FIG. 1, a display device DD according to an embodiment may be divided into a display area DA and a peripheral area PA. In an embodiment, the peripheral area PA may be located adjacent to or around the display area DA. For example, the peripheral area PA may surround the display area DA. The display device DD and various components and/or layers thereof may include a display area DA and a peripheral area PA corresponding to those described above.

In an embodiment, the display device DD may have a rectangular shape on a plane (e.g., a planar shape of a rectangle). However, the invention is not necessarily limited thereto, and the display device DD may have various planar shapes. In this case, a plane may be defined by a first direction D1 and a second direction D2 which intersects the first direction D1. A third direction D3 may cross the plane, such as to be perpendicular to the plane. A thickness of the display device DD and various components or layers thereof may be defined along the third direction D3 (e.g., a thickness direction).

At least one pixel PX may be disposed in the display area DA, and an image may be displayed through control and/or driving of the pixel PX in the display area DA. The pixel PX may include a driving device (e.g., a transistor) and a light emitting device LED (e.g., an organic light emitting diode OLED) which is connected to the driving device. The light emitting device LED may emit light by receiving a signal and/or voltage (e.g., an electrical signal) from the driving device. For example, the driving device may provide a driving current (e.g., electrical driving current) to the light emitting device LED, and the light emitting device LED may generate and emit light having a luminance corresponding to the driving current. The pixel PX may be generally disposed in the display area DA. For example, the pixel PX may be arranged in a matrix form in the display area DA.

A driver for driving the pixel PX may be disposed in the peripheral area PA. The driver may include a data driver, a gate driver, a light emitting driver, a power voltage generator, a timing controller, or the like. The driver may provide the signal and/or the voltage to the pixel PX. An image may not be displayed within the peripheral area PA (e.g., a non-display area), without being limited thereto.

Figure 2:
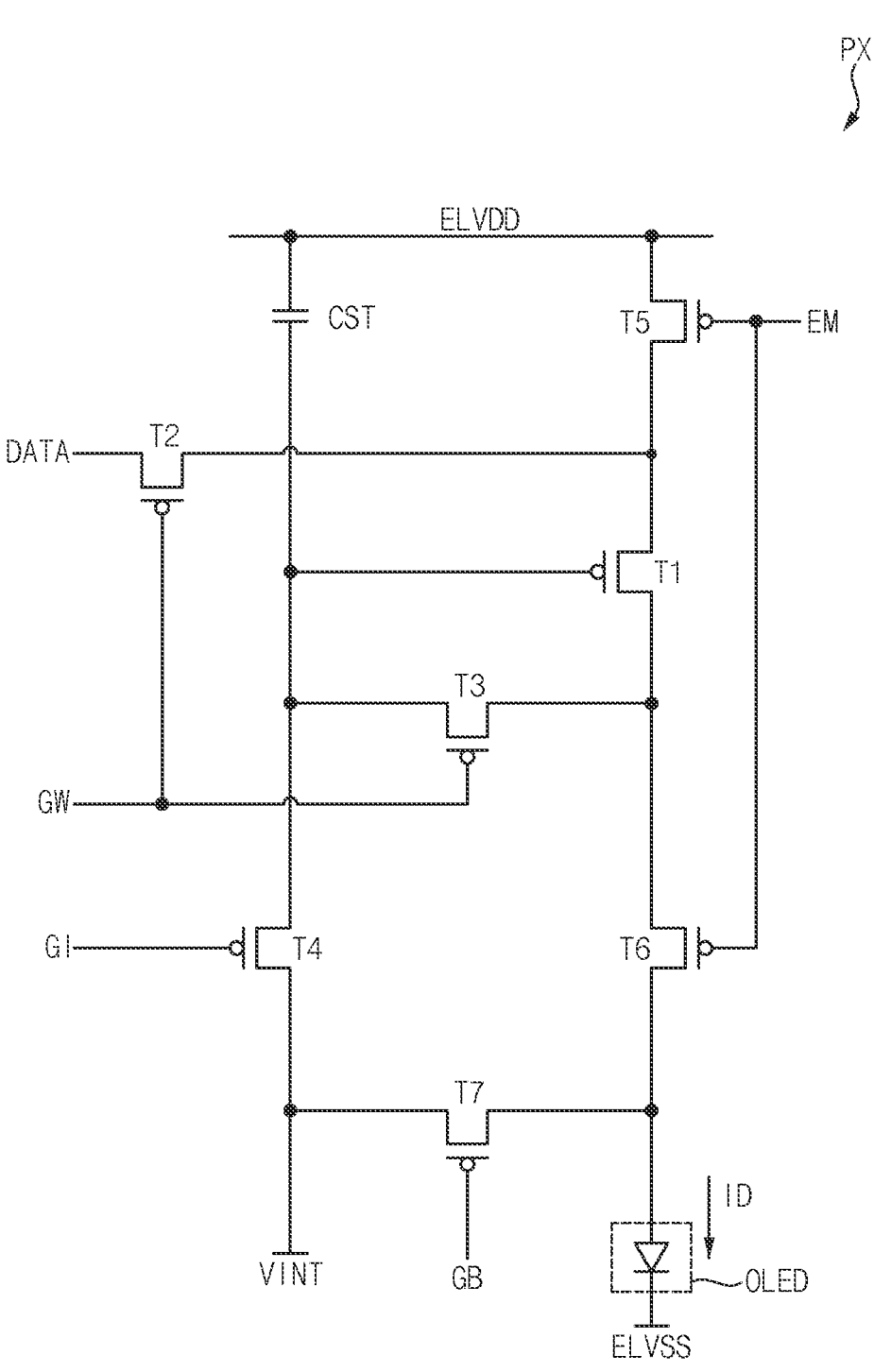
FIG. 2 is a circuit diagram illustrating a pixel included in the display device of FIG. 1, according to an embodiment.

FIG. 2 is a circuit diagram illustrating the pixel PX included in the display device DD of FIG. 1.

Referring to FIG. 2, the pixel PX may include a first transistor T1, a second transistor T2, a third transistor T3, a fourth transistor T4, a fifth transistor T5, and a sixth transistor T6, a seventh transistor T7, and a storage capacitor CST.

The first transistor T1 may include a gate terminal, a first terminal, and a second terminal. The gate terminal may be connected to the storage capacitor CST. The first terminal may be connected to the second transistor T2. The second terminal may be connected to the sixth transistor T6. The first transistor T1 may generate a driving current ID based on a voltage difference between the gate terminal and the first terminal. For example, the first transistor T1 may be referred to as a driving transistor.

The second transistor T2 may include a gate terminal, a first terminal, and a second terminal. The gate terminal of the second transistor T2 may receive a first gate signal GW. The second transistor T2 may be turned on or off in response to the first gate signal GW. The first terminal of the second transistor T2 may receive a data voltage DATA. The second transistor T2 may provide the data voltage DATA to the first terminal of the first transistor T1 in response to the first gate signal GW. For example, the second transistor T2 may be referred to as a switching transistor.

The third transistor T3 may include a gate terminal, a first terminal, and a second terminal. The gate terminal may receive the first gate signal GW. The first terminal may be connected to the gate terminal of the first transistor T1. The second terminal may be connected to the second terminal of the first transistor T1. The third transistor T3 may compensate for the threshold voltage of the first transistor T1. For example, the third transistor T3 may be referred to as a compensation transistor.

The fourth transistor T4 may include a gate terminal, a first terminal, and a second terminal. The gate terminal may receive a second gate signal GI. The first terminal may be connected to the gate terminal of the first transistor T1. The second terminal may receive an initialization voltage VINT. The fourth transistor T4 may initialize the gate terminal of the first transistor T1.

The fifth transistor T5 may include a gate terminal, a first terminal, and a second terminal. The gate terminal may receive an emission control signal EM. The first terminal may receive a high power supply voltage ELVDD. The second terminal may be connected to the first transistor T1.

The sixth transistor T6 may include a gate terminal, a first terminal, and a second terminal. The gate terminal may receive the emission control signal EM. The first terminal may be connected to a first transistor T1. The second terminal may be connected to an organic light emitting diode OLED as a light emitting device LED or light emitting element. The sixth transistor T6 may transmit the driving current ID to the organic light emitting diode OLED in response to the emission control signal EM.

The seventh transistor T7 may include a gate terminal, a first terminal, and a second terminal. The gate terminal may receive a third gate signal GB. The first terminal may be connected to the organic light emitting diode OLED. The second terminal may receive the initialization voltage VINT. The seventh transistor T7 may initialize the organic light emitting diode OLED.

The storage capacitor CST may include a first terminal and a second terminal. The first terminal may receive the high power supply voltage ELVDD. The second terminal may be connected to the gate terminal of the first transistor T1.

The organic light emitting diode OLED may include a first terminal and a second terminal. The first terminal may be connected to the sixth transistor T6. The second terminal may receive a low power supply voltage ELVSS. The organic light emitting diode OLED may generate and/or emit light based on the driving current ID.

The connection structure of the pixel PX shown in FIG. 2 is only an example and may be variously changed.

FIG. 3 is a cross-sectional view illustrating the display device DD of FIG. 1. For example, FIG. 3 is a cross-sectional view taken along line I-I' of FIG. 1.

Referring to FIG. 3, the display device DD may include a substrate SUB, a lower metal layer BML, a buffer layer BFR, a first transistor TR1, a second transistor TR2, first to third gate insulating patterns GI1, GI2 and GI3, a first interlayer insulating layer ILD1, a second interlayer insulating layer ILD2, a light emitting device LED, a pixel defining layer PDL, and a thin film encapsulation layer TFE.

The first transistor TR1 may include a first active pattern ACT1, a first gate electrode GAT1, a first connection electrode CE1, and a second connection electrode CE2. The second transistor TR2 may include a second active pattern ACT2, a second gate electrode GAT2, a third connection electrode CE3, and a fourth connection electrode CE4. The light emitting device LED may include a pixel electrode ADE, a light emitting layer EL, and a common electrode CTE.

The substrate SUB may include a transparent material or an opaque material. In an embodiment, examples of materials that can be used as the substrate SUB may include glass, quartz, plastic, or the like. These may be used alone or in combination with each other. In addition, the substrate SUB may be formed of a single layer or multiple layers in combination with each other along the thickness direction.

The lower metal layer BML may be disposed on the substrate SUB. In an embodiment, the lower metal layer BML may be formed of (or include) a metal, an alloy, a conductive metal oxide, a transparent conductive material, or the like. Examples of materials that can be used as the lower metal layer BML may include silver (Ag), an alloy containing silver, molybdenum (Mo), an alloy containing molybdenum, aluminum (Al), an alloy containing aluminum, and aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), or the like. These may be used alone or in combination with each other. Also, the lower metal layer BML may be formed as a single layer or as multiple layers in combination with each other.

In an embodiment, the lower metal layer BML may be under the first transistor TR1 and connected to the first transistor TR1 at a connection location under the first transistor TR1. Also, the lower metal layer BML may be electrically connected to the pixel electrode ADE. The lower metal layer BML may transmit externally applied signals (e.g., electrical signals) to driving devices and/or the light emitting device LED.

The buffer layer BFR may be disposed on the substrate SUB to cover the lower metal layer BML. In an embodiment, the buffer layer BFR may include an inorganic insulating material. Examples of materials that can be used as the inorganic insulating material may include silicon oxide, silicon nitride, and silicon oxynitride. These may be used alone or in combination with each other. The buffer layer BFR may prevent diffusion of metal atoms or impurities from the substrate SUB into the first active pattern ACT1. Also, the buffer layer BFR may adjust the speed of heat provided to the first active pattern ACT1 during a crystallization process for forming (or providing) the first active pattern ACT1.

In another embodiment, a barrier layer (not shown) may be additionally disposed above and/or below the lower metal layer BML. In other words, the barrier layer may be additionally disposed between the lower metal layer BML and the substrate SUB and/or between the lower metal layer BML and the buffer layer BFR, along the thickness direction. The barrier layer may be formed of an organic insulating material and/or an inorganic insulating material.

The first active pattern ACT1 may be disposed on the buffer layer BFR. In an embodiment, the first active pattern ACT1 may include a first oxide semiconductor material. Examples of the first oxide semiconductor material that can be used as the first active pattern ACT1 may include zinc oxide (ZnOx), gallium oxide (GaOx), titanium oxide (TiOx), indium oxide (InOx), indium-gallium oxide (IGO), indium-zinc oxide (IZO), gallium-zinc oxide (GZO), zinc-magnesium oxide (ZMO), zinc-zirconium oxide (ZnZrxOy), indium-gallium-zinc oxide (IGZO) and indium-gallium-hafnium oxide (IGHO), or the like. These may be used alone or in combination with each other. Specifically, the first active pattern ACT1 may include indium-gallium-zinc oxide (IGZO). In an embodiment, the first oxide semiconductor may include at least one material selected from the group consisting of the above materials, without being limited thereto.

In an embodiment, the first active pattern ACT1 may include a first connection area ACT1$a$, a second connection area ACT1$b$, and a first channel area ACT1$c$ located between the first connection area ACT1$a$ and the second connection area ACT1$b$ in a direction along the substrate SUB.

In an embodiment, the first active pattern ACT1 may be disposed to overlap (or correspond to) the lower metal layer BML, such as in a plan view (e.g., along the thickness direction). Accordingly, the first transistor TR1 may secure saturation and a driving range.

The third gate insulating pattern GI3 may be disposed on the first active pattern ACT1. In other words, the third gate insulating pattern GI3 may overlap the first active pattern ACT1. For example, the third gate insulating pattern GI3 may be disposed to directly contact the first active pattern ACT1. As being in contact, elements may form an interface with each other. In an embodiment, the third gate insulating pattern GI3 may overlap the first channel area ACT1$c$ of the first active pattern ACT1, and may be spaced apart from the first connection area ACT1$a$ and the second connection area ACT1$b$ of the first active pattern ACT1, in the direction along the substrate SUB and/or in along the thickness direction. Accordingly, the first interlayer insulating layer ILD1 may directly contact the first active pattern ACT1 at the first connection area ACT1$a$ and the second connection area ACT1$b$. Therefore, since hydrogen is diffused from the first interlayer insulating layer ILD1 adjacent to the first connection area ACT1$a$ and the second connection area ACT1$b$, the first connection area ACT1$a$ and the second connection area ACT1$b$ may be conductive.

In an embodiment, the third gate insulating pattern GI3 may include an insulating material. Examples of the insulating material that can be used as the third gate insulating pattern GI3 may include silicon oxide, silicon nitride, silicon oxynitride, or the like. These may be used alone or in combination with each other.

The first gate electrode GAT1 may be disposed on the third gate insulating pattern GI3. In other words, the first gate electrode GAT1 may overlap the first active pattern ACT1. For example, the first gate electrode GAT1 may be disposed to directly contact the third gate insulating pattern GI3. Accordingly, the third gate insulating pattern GI3 may be disposed between the first active pattern ACT1 and the first gate electrode GAT1. Accordingly, the third gate insulating pattern GI3 may directly contact the first active pattern ACT1 and the first gate electrode GAT1. In other words, only a single third gate insulating pattern GI3 may be disposed between the first active pattern ACT1 and the first gate electrode GAT1.

In an embodiment, the first gate electrode GAT1 may be formed of (or include) metal, alloy, conductive metal oxide, transparent conductive material, or the like. Examples of materials that can be used as the first gate electrode GAT1 may include silver (Ag), an alloy containing silver, molybdenum (Mo), an alloy containing molybdenum, aluminum (Al), an alloy containing aluminum, and aluminum nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt), scandium (Sc), indium-tin oxide (ITO), indium-zinc oxide (IZO), or the like. These may be used alone or in combination with each other.

The second gate insulating pattern GI2 may be disposed on the buffer layer BFR. In an embodiment, the second gate insulating pattern GI2 may be spaced apart from the first active pattern ACT1 (e.g., in the direction along the substrate SUB). In an embodiment, the second gate insulating pattern GI2 may be formed together with the third gate insulating pattern GI3. In other words, the second gate insulating pattern GI2 may include the same material as the third gate insulating pattern GI3. For example, the second gate insulating pattern GI2 may include an insulating material. Examples of the insulating material that can be used as the third gate insulating pattern GI3 may include silicon oxide, silicon nitride, silicon oxynitride, or the like. These may be used alone or in combination with each other. The second gate insulating pattern GI2 may be in a same layer as the third gate insulating pattern GI3, such as in a gate insulating pattern layer including a plurality of gate insulating patterns (e.g., the second gate insulating pattern GI2 and the third gate insulating pattern GI3). As being in a same layer, elements may be formed or provided in a same process so as to include a same material as each other, elements may be respective portions or patterns of a same material layer, elements may be on a same layer by forming an interface with a same underlying or overlying layer, etc., without being limited thereto.

The second active pattern ACT2 may be disposed on the second gate insulating pattern GI2. In an embodiment, the second active pattern ACT2 may be spaced apart from the first active pattern ACT1. In an embodiment, the second active pattern ACT2 may include a second oxide semiconductor material. The second oxide semiconductor material may be different from the first oxide semiconductor. In other words, the first active pattern ACT1 and the second active pattern ACT2 may include different oxidation materials.

In an embodiment, the second oxide semiconductor may include tin (Sn). Examples of the second oxide semiconductor material that can be used as the second active pattern ACT2 may include tin oxide (SnOx), indium-tin oxide (ITO), zinc-tin oxide (ZTO), indium-zinc-tin oxide (IZTO). tin-aluminum-zinc oxide (TAZO), indium-gallium-tin oxide (IGTO), indium-tin-gallium-zinc oxide (ITGZO), or the like. These may be used alone or in combination with each other. Specifically, the second active pattern ACT2 may include indium-tin-gallium-zinc oxide (ITGZO). In an embodiment, the second oxide semiconductor may include at least one material selected from the group consisting of the above materials.

In an embodiment, the second active pattern ACT2 may include a third connection area ACT2a, a fourth connection area ACT2b, and a second channel area ACT2c located between the third connection area ACT2a and the fourth connection area ACT2b.

The first gate insulating pattern GI1 may be disposed on the second active pattern ACT2. In other words, the first gate insulating pattern GI1 may overlap the second active pattern ACT2. For example, the first gate insulating pattern GI1 may directly contact the second active pattern ACT2. In an embodiment, the first gate insulating pattern GI1 may overlap the second channel area ACT2c of the second active pattern ACT2, and may be spaced apart from the third connection area ACT2a and the fourth connection area ACT2b of the second active pattern ACT2. Accordingly, the first interlayer insulating layer ILD1 may directly contact the third connection area ACT2a and the fourth connection area ACT2b. Therefore, since hydrogen is diffused from the first interlayer insulating layer ILD1 adjacent to the third connection area ACT2a and the fourth connection area ACT2b, the third connection area ACT2a and the fourth connection area ACT2b may be conductive.

In an embodiment, the first gate insulating pattern GI1 may include an insulating material. Examples of an insulating material that can be used as the first gate insulating pattern GI1 may include silicon oxide, silicon nitride, silicon oxynitride, or the like. These may be used alone or in combination with each other.

The second gate electrode GAT2 may be disposed on the first gate insulating pattern GI1. In other words, the second gate electrode GAT2 may overlap the second active pattern ACT2. For example, the second gate electrode GAT2 may directly contact the first gate insulating pattern GI1. Accordingly, the first gate insulating pattern GI1 may be disposed between the second active pattern ACT2 and the second gate electrode GAT2 and directly contact the second active pattern ACT2 and the second gate electrode GAT2.

In an embodiment, the second gate electrode GAT2 may be formed together with the first gate electrode GAT1, such as to be respective patterns of a same material layer on the substrate SUB. In other words, the second gate electrode GAT2 may include the same material as the first gate electrode GAT1. For example, the second gate electrode GAT2 may be formed of metal, alloy, conductive metal oxide, transparent conductive material, or the like. Examples of materials that can be used as the second gate electrode GAT2 may include silver (Ag), an alloy containing silver, molybdenum (Mo), an alloy containing molybdenum, aluminum (Al), an alloy containing aluminum, and aluminum nitride (AlN), Tungsten (W), Tungsten Nitride (WN), Copper (Cu), Nickel (Ni), Chromium (Cr), Chromium Nitride (CrN), Titanium (Ti), Tantalum (Ta), Platinum (Pt), scandium (Sc), indium-tin oxide (ITO), indium-zinc oxide (IZO), or the like. These may be used alone or in combination with each other.

The first interlayer insulating layer ILD1 may be disposed on the buffer layer BFR. The first interlayer insulating layer ILD1 may be disposed to cover the first active pattern ACT1, the second active pattern ACT2, the first to third gate insulating patterns GI1, GI2, and GI3, the first gate electrode GAT1, and the second gate electrode GAT2.

The first interlayer insulating layer ILD1 may include an insulating material. Examples of the insulating material that can be used as the first interlayer insulating layer ILD1 may include silicon oxide, silicon nitride, silicon oxynitride, or the like. These may be used alone or in combination with each other. In an embodiment, a plurality of contact holes may be defined in the first interlayer insulating layer ILD1.

The first to fourth connection electrodes CE1, CE2, CE3, and CE4 may be disposed on the first interlayer insulating layer ILD1. The first to fourth connection electrodes CE1, CE2, CE3, and CE4 may be in a same layer as each other. Each of the first connection electrode CE1 and the second connection electrode CE2 may contact the first active pattern ACT1 through contact holes, respectively. For example, the first connection electrode CE1 may contact the first connection area ACT1a of the first active pattern ACT1 through a first contact hole, and the second connection electrode CE2 may contact the second connection area ACT1b through a second contact hole. Based on the signal applied to the first gate electrode GAT1, the first connection electrode CE1 and the second connection electrode CE2 may be electrically connected to each other. The contact holes may be defined in the first interlayer insulating layer ILD1, at positions corresponding to the first connection area ACT1a and the second connection area ACT1b, respectively.

In an embodiment, the first connection electrode CE1 which is connected to the first active pattern ACT1 at the first connection area ACT1a may also contact the lower metal layer BML. For example, the first connection electrode CE1 may contact the lower metal layer BML through a third contact hole penetrating both the first interlayer insulating layer ILD1 and the buffer layer BFR. In this case, based on the signal applied to the first gate electrode GAT1, the first connection electrode CE1, the second connection electrode CE2, and the lower metal layer BML may be electrically connected to each other.

Each of the third connection electrode CE3 and the fourth connection electrode CE4 may contact the second active pattern ACT2 through contact holes, respectively. For example, the third connection electrode CE3 may contact the third connection area ACT2a of the second active pattern ACT2 through a fifth contact hole, and the fourth connection electrode CE4 may contact the fourth connection area ACT2b of the second active pattern ACT2 through a sixth contact hole. Based on the signal applied to the second gate electrode GAT2, the third connection electrode CE3 and the fourth connection electrode CE4 may be electrically connected to each other.

In an embodiment, each of the first to fourth connection electrodes CE1, CE2, CE3, and CE4 may include a metal, an alloy, a conductive metal oxide, a transparent conductive material, or the like. Examples of materials that can be used as the first to fourth connection electrodes CE1, CE2, CE3, and CE4 may include silver (Ag), an alloy containing silver, molybdenum (Mo), an alloy containing molybdenum, and aluminum (Al).), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and the like. These may be used alone or in combination with each other.

The first active pattern ACT1, the first gate electrode GAT1, the first connection electrode CE1, and the second connection electrode CE2 may together constitute the first transistor TR1. In an embodiment, the first transistor TR1 may generate the driving current. In other words, the first transistor TR1 may be referred to as a driving transistor. For example, the first transistor TR1 may correspond to the first transistor T1 of the circuit diagram described with reference to FIG. 2. The second active pattern ACT2, the second gate electrode GAT2, the third connection electrode CE3, and the fourth connection electrode CE4 may together constitute the second transistor TR2. In an embodiment, the second transistor TR2 may be turned on or off according to the provided signal. In other words, the second transistor TR2 may be referred to as a switching transistor. For example, the second transistor TR2 may correspond to the second transistor T2 of the circuit diagram described with reference to FIG. 2.

The second interlayer insulating layer ILD2 may be disposed on the first interlayer insulating layer ILD1. The second interlayer insulating layer ILD2 may be disposed to cover the first to fourth connection electrodes CE1, CE2, CE3, and CE4. In an embodiment, a contact hole (such as a fourth contact hole, not shown) exposing a portion of the first connection electrode CE1 may be defined in the second interlayer insulating layer ILD2. That is, the first connection electrode CE1 may be exposed to outside the second interlayer insulating layer ILD2 at the respective contact hole (not shown) defined in the second interlayer insulating layer ILD2.

In an embodiment, the second interlayer insulating layer ILD2 may include an organic material. Examples of the organic material that can be used as the second interlayer insulating layer ILD2 may include polyacrylic resin, polyimide resin, acrylic resin, or the like. These may be used alone or in combination with each other.

In an embodiment, a third interlayer insulating layer (not shown) may be additionally disposed between the first interlayer insulating layer ILD1 and the second interlayer insulating layer ILD2. In this case, the third interlayer insulating layer may be disposed on the first interlayer insulating layer ILD1 to cover the first to fourth connection electrodes CE1, CE2, CE3, and CE4, and the second interlayer insulating layer ILD2 may be disposed on the third interlayer insulating layer.

In an embodiment, the third interlayer insulating layer may include an inorganic material. Examples of the inorganic material that can be used as the third interlayer insulating layer may include silicon oxide, silicon nitride, silicon oxynitride, or the like. These may be used alone or in combination with each other.

The pixel electrode ADE may be disposed on the second interlayer insulating layer ILD2. The pixel electrode ADE may contact the first connection electrode CE1 through the respective contact hole (not shown) defined in the second interlayer insulating layer ILD2. In an embodiment, the respective contact hole (not shown) may be disposed in the display area DA. Accordingly, the pixel electrode ADE may be electrically connected to the first transistor TR1. The pixel electrode ADE may include a conductive material such as a metal, an alloy, a conductive metal nitride, a conductive metal oxide, or a transparent conductive material. The pixel electrode ADE may have a single-layer structure or a multilayer structure including a plurality of conductive layers.

The pixel defining layer PDL may be disposed on the second interlayer insulating layer ILD2. A pixel opening exposing a portion of the pixel electrode ADE may be defined in the pixel defining layer PDL. That is, the pixel electrode ADE may be exposed to outside the pixel defining layer PDL by the pixel opening. In an embodiment, the pixel defining layer PDL may include an organic material.

The light emitting layer EL may be disposed on the pixel electrode ADE. In an embodiment, the light emitting layer EL may be disposed on the pixel electrode ADE exposed to outside the pixel defining layer PDL by the pixel opening. However, the invention is not necessarily limited thereto, and in an embodiment, the light emitting layer EL may be disposed on the pixel electrode ADE and on the pixel defining layer PDL. That is, the light emitting layer EL may extend from the pixel electrode ADE, and along a sidewall of the pixel defining layer PDL which defines the pixel opening. The light emitting layer EL may further extend from the sidewall to an upper surface of the pixel defining layer PDL which is farthest from the substrate SUB, without being limited thereto.

The common electrode CTE may be disposed on the light emitting layer EL and on the pixel defining layer PDL. The pixel electrode ADE, the light emitting layer EL, and the common electrode CTE may together constitute the light emitting device LED. The light emitting layer EL may emit light based on a voltage difference between the pixel electrode ADE and the common electrode CTE.

The thin film encapsulation layer TFE may be disposed on the common electrode CTE. The thin film encapsulation layer TFE may protect the light emitting device LED from impurities such as oxygen and moisture. In an embodiment, the thin film encapsulation layer TFE may include at least one inorganic encapsulation layer and at least one organic encapsulation layer.

The display device DD according to one or more embodiment may include the first transistor TR1 and the second transistor TR2. The first transistor TR1 may include the first active pattern ACT1 including the first oxide semiconductor, and the second transistor TR2 may include the second active pattern ACT2 including the second oxide semiconductor different from the first oxide semiconductor. Accordingly, the first transistor TR1 and the second transistor TR2 may have different electron mobilities. Accordingly, a display quality of the display device DD may be improved.

In addition, the third gate insulating pattern GI3 may be disposed between the first active pattern ACT1 and the first gate electrode GAT1, and the third gate insulating pattern GI3 may be disposed to directly contact the first active pattern ACT1 and the gate electrode GAT1. In other words, only the single third gate insulating pattern GI3 may be disposed between the first active pattern ACT1 and the first gate electrode GAT1. Accordingly, a distance between the first active pattern ACT1 and the first gate electrode GAT1 may be shortened. Accordingly, the efficiency of the first transistor TR1 may be improved. Accordingly, a light emitting efficiency of the display device DD may be improved.

FIGS. 4 to 18 are cross-sectional views illustrating a method of manufacturing (or providing) the display device DD of FIG. 1.

Figure 4:
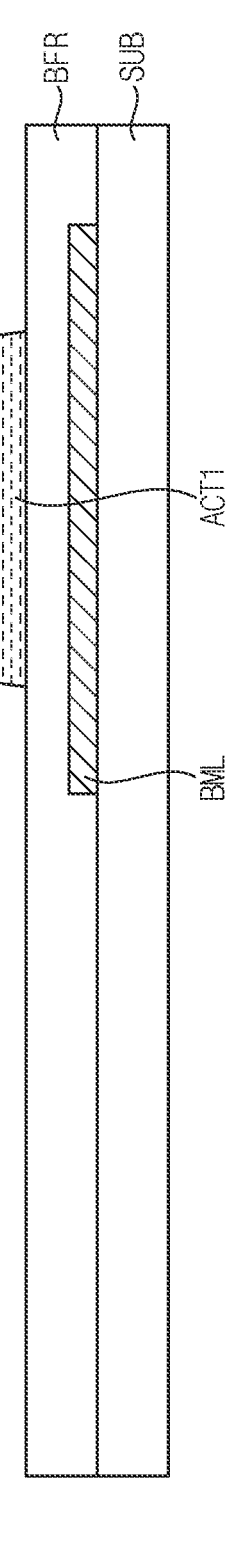

Referring to FIG. 4, the lower metal layer BML may be formed (or provided) on the substrate SUB, and the buffer layer BFR covering the lower metal layer BML may be formed on the substrate SUB. The first active pattern ACT1 may be formed on the buffer layer BFR. The first active pattern ACT1 may include the first oxide semiconductor.

Examples of the first oxide semiconductor that can be used as the first active pattern ACT1 may include zinc oxide (ZnOx), gallium oxide (GaOx), titanium oxide (TiOx), indium oxide (InOx), indium-gallium oxide (IGO), indium-zinc oxide (IZO), gallium-zinc oxide (GZO), zinc-magnesium oxide (ZMO), zinc-zirconium oxide (ZnZrxOy), indium-gallium-zinc oxide (IGZO), indium-gallium-hafnium oxide (IGHO), or the like. These may be used alone or in combination with each other.

Referring to FIG. 5, a first preliminary gate insulating film PGI1 covering the first active pattern ACT1 may be formed on the buffer layer BFR. Thereafter, an oxide semiconductor film OS may be formed on the first preliminary gate insulating film PGI1. The oxide semiconductor film OS may include the second oxide semiconductor different from the first oxide semiconductor. In an embodiment, the second oxide semiconductor may include tin (Sn). Examples of the second oxide semiconductor that can be used as the oxide semiconductor film OS may include tin oxide (SnOx), indium-tin oxide (ITO), zinc-tin oxide (ZTO), indium-zinc-tin oxide (IZTO), tin-aluminum-zinc oxide (TAZO), indium-gallium-tin oxide (IGTO), indium-tin-gallium-zinc oxide (ITGZO), or the like. These may be used alone or in combination with each other. Thereafter, a second preliminary gate insulating film PGI2 may be formed on the oxide semiconductor film OS.

Figure 6:
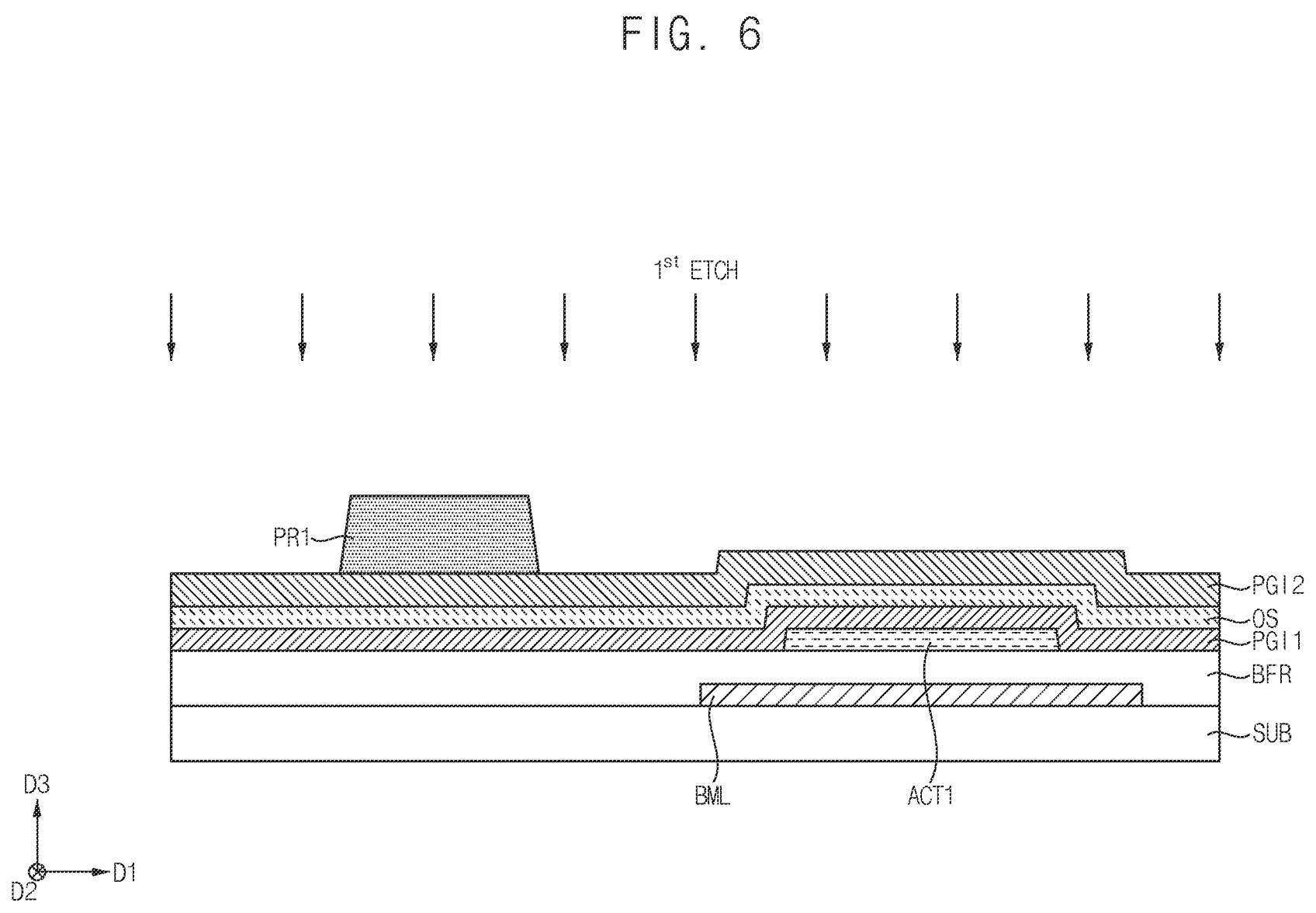

Referring to FIG. 6, a first photoresist pattern PR1 may be formed on the second preliminary gate insulating film PGI2. The first photoresist pattern PR1 may be formed to cover a portion of the second preliminary gate insulating film PGI2, and expose another portion thereof different from the covered portion (e.g., an exposed portion), such as a remaining portion, without being limited thereto. In an embodiment, the first photoresist pattern PR1 may be formed by forming a first photoresist film on the second preliminary gate insulating film PGI2 entirely (e.g., on an entirety of the second preliminary gate insulating film PGI2) and then exposing and developing the first photoresist film.

Referring to FIGS. 6 and 7, the first gate insulating pattern GI1 may be formed by removing a portion of the second preliminary gate insulating film PGI2 which is exposed from the first photoresist pattern PR1. Accordingly, the first gate insulating pattern GI1 may be formed to overlap the first photoresist pattern PR1 as a remaining portion of the second preliminary gate insulating film PGI2. The first gate insulating pattern GI1 may cover a portion of the oxide semiconductor film OS, and expose another portion thereof. The first gate insulating pattern GI1 may be formed to be spaced apart from the first active pattern ACT1, both in a direction along the substrate SUB and in a thickness direction.

In an embodiment, the portion of the second preliminary gate insulating film PGI2 exposed from the first photoresist pattern PR1 may be removed through a first etching process ($1^{st}$ ETCH in FIG. 6). In other words, the first gate insulating pattern GI1 may be formed by etching the second preliminary gate insulating film PGI2 by using the first photoresist pattern PR1 as a mask. In an embodiment, the first etching process may be a dry etching process, but the invention is not necessarily limited thereto.

Figure 8:
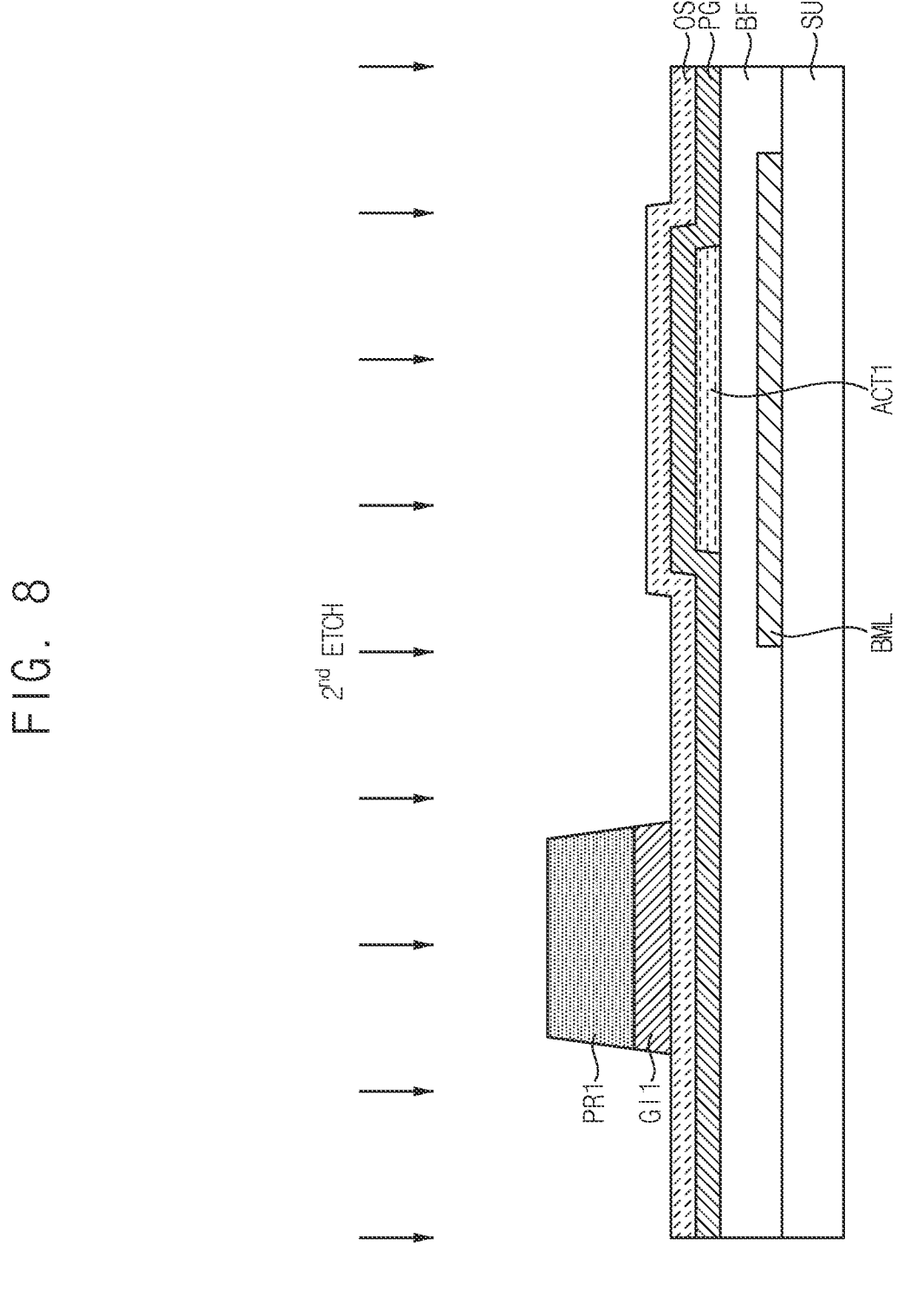

Referring to FIGS. 8 and 9, the second active pattern ACT2 may be formed by removing a portion of the oxide semiconductor film OS exposed from the first gate insulating pattern GI1. Accordingly, the second active pattern ACT2 may be formed to overlap the first gate insulating pattern GI1 as a remaining portion of the oxide semiconductor film OS. The second active pattern ACT2 may cover a portion of the first preliminary gate insulating film PGI1 and expose another portion thereof. The second active pattern ACT2 may be formed to be spaced apart from the first active pattern ACT1. The second active pattern ACT2 may include the second oxide semiconductor.

In an embodiment, the portion of the oxide semiconductor film OS exposed from the first gate insulating pattern GI1 may be removed by a second etching process (2nd ETCH in FIG. 8). In other words, the second active pattern ACT2 may be formed by etching the oxide semiconductor film OS by using the first photoresist pattern PR1 together with the first gate insulating pattern GI1 as a mask. In an embodiment, the second etching process may be a wet etching process, but the invention is not necessarily limited thereto.

Figure 10:
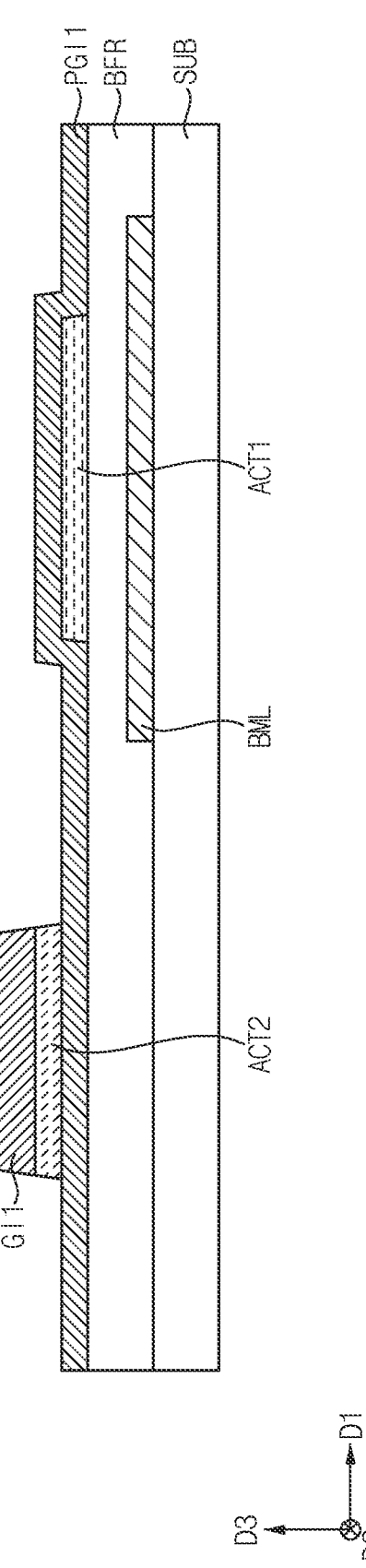

Referring to FIG. 10, the first photoresist pattern PR1 remaining on the first gate insulating pattern GI1 may be removed. The first photoresist pattern PR1 may be removed through an ashing process or a strip process. The removing of the first photoresist pattern PR1 exposes an upper surface of the first gate insulating pattern GI1 to outside the stacked structure of FIG. 10 (e.g., an exposed surface). As used herein, an upper surface may be farthest from the substrate SUB along the thickness direction while a lower surface may be closest to the substrate SUB along the thickness direction, but are not limited thereto.

Figure 11:
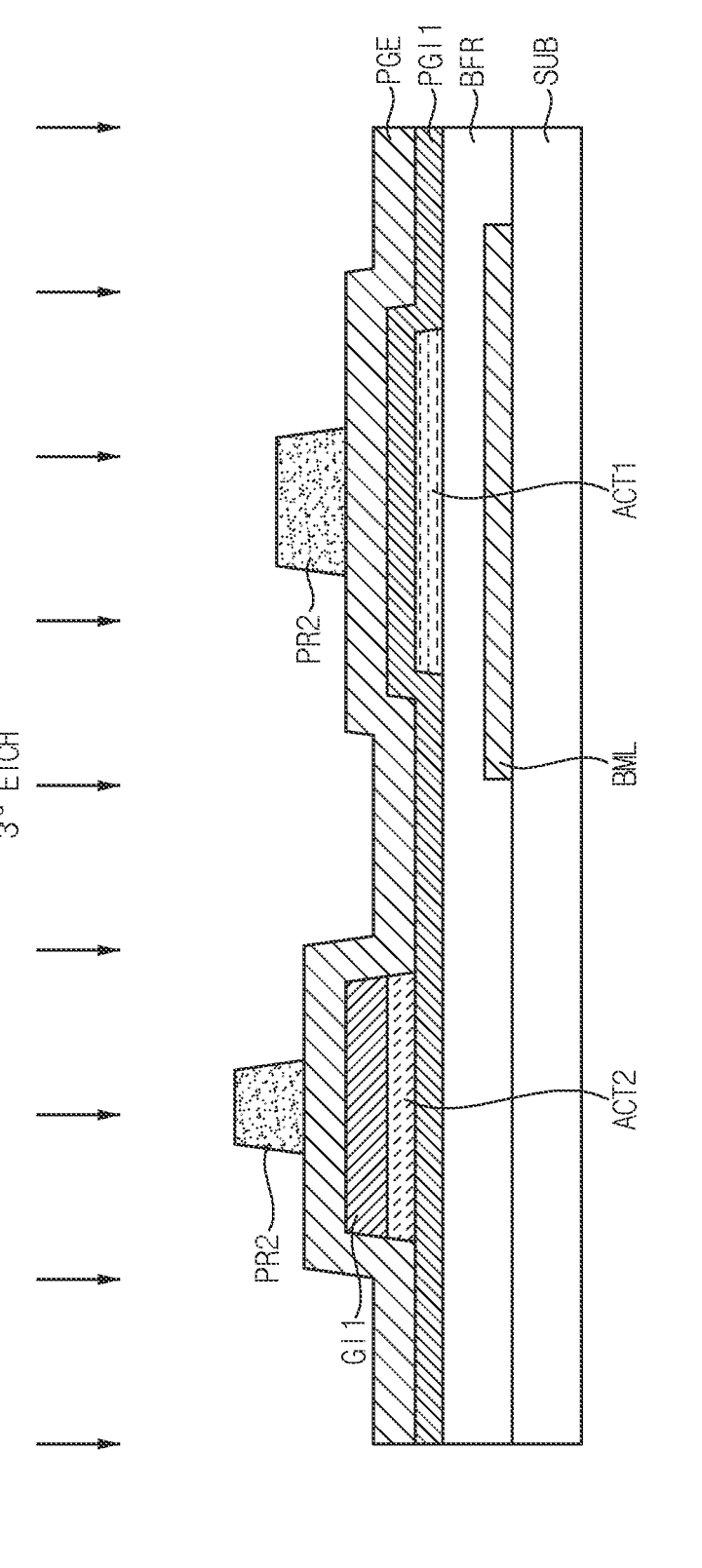

Referring to FIG. 11, a preliminary gate electrode film PGE may be formed on the first preliminary gate insulating film PGI1 and along both side surfaces and the upper surface of the first gate insulating pattern GI1. The preliminary gate electrode film PGE may be formed to cover both the first gate insulating pattern GI1 and the second active pattern ACT2. Thereafter, a second photoresist pattern PR2 may be formed on the preliminary gate electrode film PGE. The second photoresist pattern PR2 may be formed to cover a portion of the preliminary gate electrode film PGE at locations thereof corresponding to respective active layer patterns, and expose another portion. In an embodiment, the second photoresist pattern PR2 may be formed by forming the second photoresist film on the preliminary gate electrode film PGE entirely, and then exposing and developing the second photoresist film. In an embodiment, the second photoresist pattern PR2 may be formed on each of the first active pattern ACT1 and the second active pattern ACT2.

Referring to FIGS. 11 and 12, the first gate electrode GAT1 and the second gate electrode GAT2 may be formed by removing the portion of the preliminary gate electrode film PGE which is exposed from the second photoresist pattern PR2. Accordingly, each of the first gate electrode GAT1 and the second gate electrode GAT2 may be formed to overlap the second photoresist pattern PR2 as respective patterns of the same material layer (e.g., the preliminary gate electrode film PGE). The first gate electrode GAT1 may cover a portion of the first preliminary gate insulating film PGI1, and the second gate electrode GAT2 may cover a portion of the first gate insulating pattern GI1, where such portions are closest to the respective gate electrodes along the thickness direction. In an embodiment, the first gate electrode GAT1 may be formed on the first active pattern ACT1, and the second gate electrode GAT2 may be formed on the second active pattern ACT2.

In an embodiment, the portion of the preliminary gate electrode film PGE exposed from the second photoresist pattern PR2 may be removed through a third etching process (3$^{rd}$ ETCH in FIG. 11). In other words, the first gate electrode GAT1 and the second gate electrode GAT2 may be formed by etching the preliminary gate electrode film PGE by using the second photoresist pattern PR2 as a mask. In an embodiment, the third etching process may be a dry etching process, but the invention is not necessarily limited thereto.

Referring to FIGS. 13 and 14, the second gate insulating pattern GI2 and third gate insulating pattern GI3 may be formed by removing a portion of the first preliminary gate insulating film PGI1 exposed from each of the second photoresist pattern PR2, the first gate electrode GAT1, the second gate electrode GAT2, the first gate insulating pattern GI1, and the second active pattern ACT2. The second gate insulating pattern GI2 may be formed below the second active pattern ACT2, that is, closer to the substrate SUB than the second active pattern ACT2. In other words, the second gate insulating pattern GI2 may be formed to overlap the second active pattern ACT2. The third gate insulating pattern G13 as a single layer or single pattern, may be formed between the first active pattern ACT1 and the first gate electrode GAT1. For example, the third gate insulating pattern GI3 may be formed to directly contact the first active pattern ACT1 and the first gate electrode GAT1. In other words, the third gate insulating pattern GI3 may be formed to overlap the first active pattern ACT1 and the first gate electrode GAT1.

In an embodiment, the third gate insulating pattern GI3 may be formed to overlap the first channel area ACT1c of the first active pattern ACT1, and may be formed to be spaced apart from the first connection area ACT1a and the second connection area ACT1b of the first active pattern ACT1. As being spaced apart from the connection areas, the third gate insulating pattern G13 does contact the respective connection areas of the first active pattern ACT1 and may contact only the first channel area ACT1c of the first active pattern ACT1 among the various areas thereof.

Referring to FIG. 3 and FIG. 14, for example, while a lowest point of the third gate insulating pattern GI3 is shown to be very close to the respective connection areas, the third gate insulating pattern GI3 is disclosed herein as non-contacting the respective connection areas of the first active pattern ACT1 and more particularly as being spaced apart from the respective connection areas, in at least a planar direction (e.g., along the first direction D1 and/or the second direction D2) taken along the substrate SUB.

Since the third gate insulating pattern GI3 does not contact the respective connection areas of the first active pattern ACT1, accordingly, the first interlayer insulating layer ILD1 may directly contact the first connection area ACT1a and the second connection area ACT1b. Therefore, since hydrogen is diffused from the first interlayer insulating layer ILD1 adjacent to the first connection area ACT1a and the second connection area ACT1b, the first connection area ACT1a and the second connection area ACT1b may be conductive.

In an embodiment, the portion of the first preliminary gate insulating film PGI1 exposed from each of the second photoresist pattern PR2, the first gate electrode GAT1, the second gate electrode GAT2, the first gate insulating pattern GI1, and second active pattern ACT2 may be removed through a fourth etching process (4th ETCH in FIG. 13). In other words, the second gate insulating pattern GI2 and the third gate insulating pattern G13 may be formed by etching the preliminary gate electrode film PGE by using the second photoresist pattern PR2 together with the first gate electrode GAT1, the second gate electrode GAT2, the first gate insulating pattern GI1, and the second active pattern ACT2 as a mask. In an embodiment, the fourth etching process may be a dry etching process, but the invention is not necessarily limited thereto.

In an embodiment, during the fourth etching process, a portion of the first gate insulating pattern GI1 may be etched together with an exposed portion of the first preliminary gate insulating film PGI1. For example, the portion of the first gate insulating pattern GI1 exposed from the second photoresist pattern PR2 together with the second gate electrode GAT2, may be etched together with the exposed portion of the first preliminary gate insulating film PGI1. Accordingly, a planar dimension of the first gate insulating pattern GI1 along the planar direction may be reduced to expose upper surface portions of the second active pattern ACT2 from the first gate insulating pattern GI1.

For example, the third connection area ACT2a and the fourth connection area ACT2b of the second active pattern ACT2 may be exposed from the first gate insulating pattern GI1. In other words, the first gate insulating pattern GI1 may be formed to overlap only the second channel area ACT2c of the second active pattern ACT2 and may be formed to be spaced apart from the third connection area ACT2a and the fourth connection area ACT2b of the second active pattern ACT2. Referring again to FIG. 3 and FIG. 14, for example, while a lowest point of the first gate insulating pattern GI1 is shown to be very close to the respective connection areas, the first gate insulating pattern GI1 is disclosed herein as non-contacting the respective connection areas of the second active pattern ACT2 and more particularly as being spaced apart from the respective connection areas, in at least a planar direction (e.g., along the first direction D1 and/or the second direction D2) taken along the substrate SUB.

Since the first gate insulating pattern GI1 does not contact the respective connection areas of the second active pattern ACT2, accordingly, the first interlayer insulating layer ILD1 may be formed to directly contact the third connection area ACT2a and the fourth connection area ACT2b. Therefore, since hydrogen is diffused from the first interlayer insulating layer ILD1 adjacent to the third connection area ACT2a and the fourth connection area ACT2b, the third connection area ACT2a and the fourth connection area ACT2b may be conductive.

Referring to FIG. 15, the second photoresist pattern PR2 remaining on the first gate electrode GAT1 and the second gate electrode GAT2 may be removed. The second photoresist pattern PR2 may be removed through an ashing process or a strip process.

Figure 16:
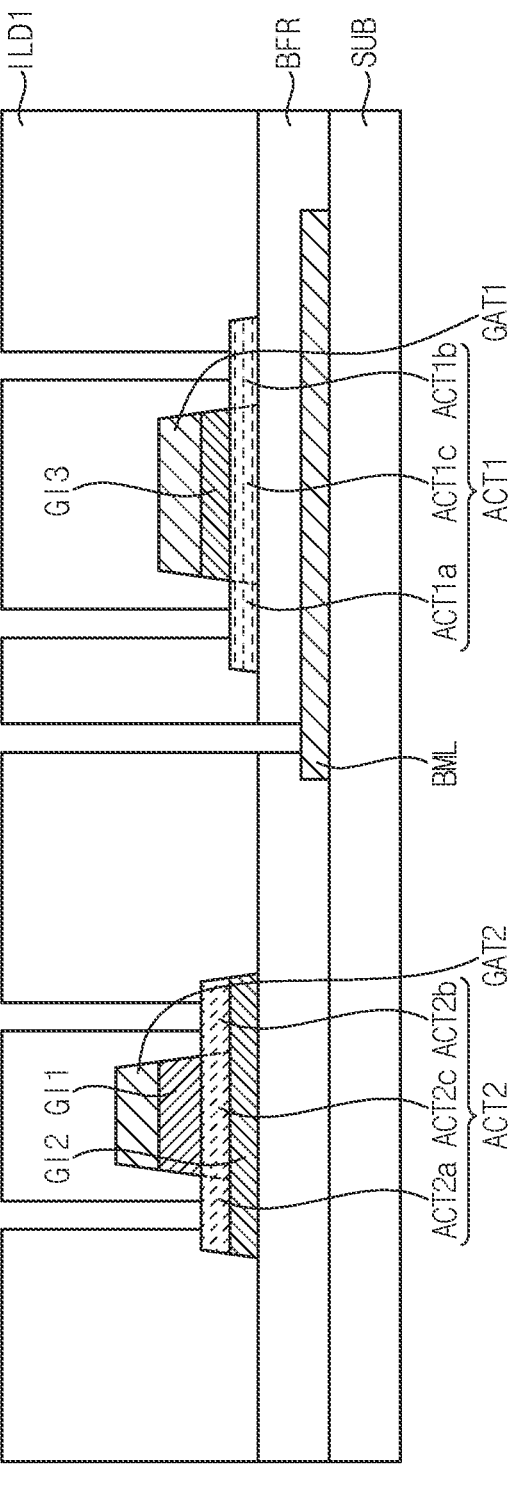

Referring to FIG. 16, the first interlayer insulating layer ILD1 may be formed on the buffer layer BFR. The first interlayer insulating layer ILD1 may be formed to cover the first active pattern ACT1, the second active pattern ACT2, the first to third gate insulating patterns GI1, GI2, and GI3, the first gate electrode GAT1, and the second gate electrode GAT2, together with the exposed positions of buffer layer BFR. A plurality of contact holes respectively exposing the first connection area ACT1a, the second connection area ACT1b, the third connection area ACT2a, and the fourth connection area ACT2b to outside the first interlayer insulating layer ILD1 may be formed in (or defined in) the first interlayer insulating layer ILD1. That is, solid portions of the first interlayer insulating layer ILD1 may define the contact holes.

Figure 17:
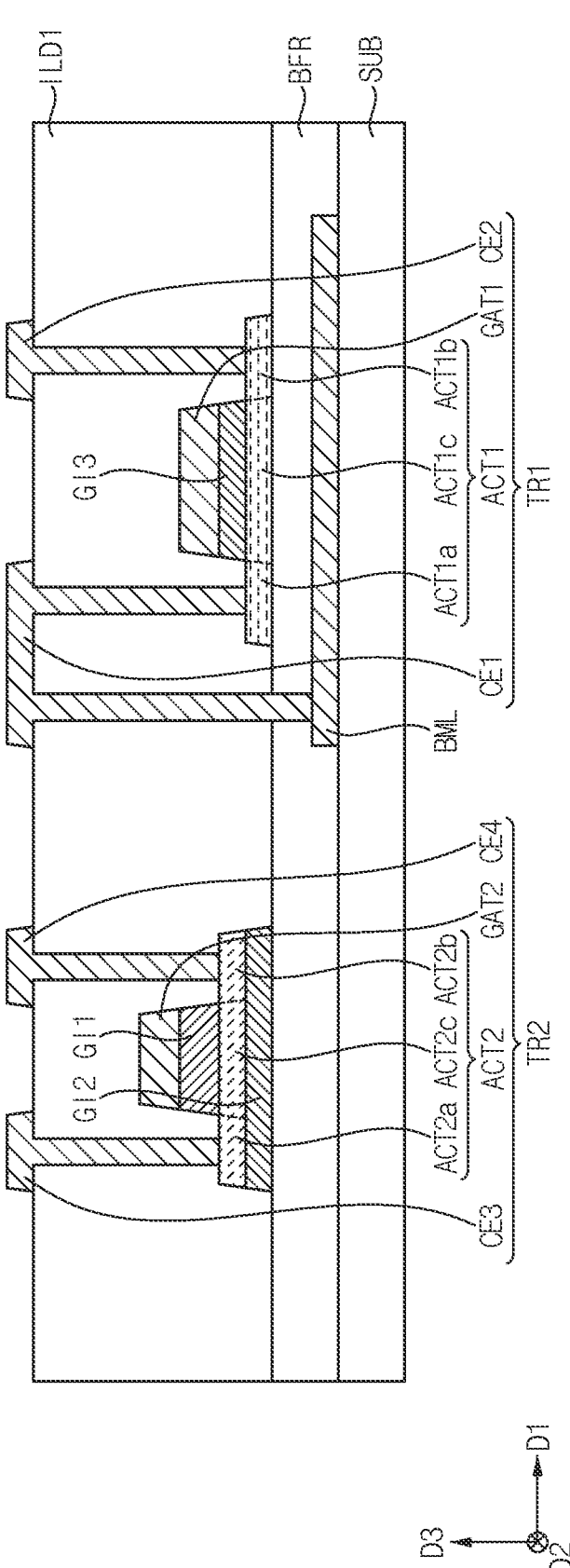

Referring to FIG. 17, a connection electrode provided in plural including the first to fourth connection electrodes CE1, CE2, CE3, and CE4 may be formed on the first interlayer insulating layer ILD1 to respectively fill the contact holes and provide a connection electrode layer. The first to fourth connection electrodes CE1, CE2, CE3, and CE4 may be formed by patterning a conductive material layer formed on the first interlayer insulating layer ILD1. In an embodiment, the first connection electrode CE1 may contact the first connection area ACT1a, the second connection electrode CE2 may contact the second connection area ACT1b, the third connection electrode CE3 may contact the third connection area ACT2a, and the fourth connection electrode CE4 may contact the fourth connection area ACT2b. One or more of the connection electrodes among the first to fourth connection electrodes CE1, CE2, CE3, and CE4 may extend out of a respective contact hole and along an upper surface of the first interlayer insulating layer ILD1.

The first active pattern ACT1, the first gate electrode GAT1, the first connection electrode CE1, and the second connection electrode CE2 may together constitute the first transistor TR1 and the second active pattern ACT2, the second gate electrode GAT2, the third connection electrode CE3, and the fourth connection electrode CE4 may together constitute the second transistor TR2.

In an embodiment, the first connection electrode CE1 contacting the first active pattern ACT1 at a first contact hole may further contact the lower metal layer BML at another contact hole (e.g., a third contact hole). For example, the first connection electrode CE1 may contact the lower metal layer BML through a contact hole penetrating both of the first interlayer insulating layer ILD1 and the buffer layer BFR, where such contact hole is spaced apart from the first contact hole and the first active pattern ACT1.

Figure 18:
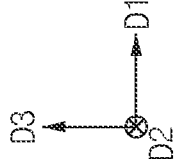

Referring to FIG. 18, the second interlayer insulating layer ILD2 may be formed on the first interlayer insulating layer ILD1. The second interlayer insulating layer ILD2 may be formed to cover the connection electrode layer including the first to fourth connection electrodes CE1, CE2, CE3, and CE4.

Thereafter, a contact hole (not shown) exposing the first connection electrode CE1 to outside the second interlayer insulating layer ILD2 may be formed, and the pixel electrode ADE may be formed on the second interlayer insulating layer ILD2 to fill the contact hole (not shown). Accordingly, the pixel electrode ADE may be electrically connected to the first transistor TR1. The contact hole (not shown) at which the pixel electrode ADE is connected to the first connection electrode CE1 may be spaced apart from the various transistor contact holes described above.

Thereafter, the pixel defining layer PDL may be formed on the second interlayer insulating layer ILD2 to define the pixel opening exposing the pixel electrode ADE to outside the pixel defining layer PDL. Thereafter, the light emitting layer EL may be formed on an exposed portion of the pixel electrode ADE, and the common electrode CTE may be formed on the light emitting layer EL. The pixel electrode ADE, the light emitting layer EL, and the common electrode CTE may together constitute the light emitting device LED. Thereafter, the thin film encapsulation layer TFE may be formed on the light emitting device LED, to provide the display device DD.

Herein, layers BML through the connection electrode layer may together be referred to as a pixel circuit layer. Layers ADE through the light emitting device LED may together be referred to as a display element layer. The pixel circuit layer together with the display element layer may be portions of a display panel including (or excluding) an encapsulation layer (e.g., the thin film encapsulation layer TFE). In embodiments, the display device DD (or the display panel) may be a part of an electronic device.

According to one or more embodiment of a method of manufacturing (or providing) a display device DD, the process of forming the second gate insulating pattern GI2 and the third gate insulating pattern GI3 by removing the portion of the first preliminary gate insulating film PGI1, and the process of forming the first gate insulating pattern GI1 by removing the portion of the preliminary gate insulating film PGI2, may be performed as separate etching processes. Accordingly, a total thickness of the preliminary gate insulating films to be removed for each etching process may be reduced. Accordingly, a damage to the first active pattern ACT1 and the second active pattern ACT2 due to the etching process may be minimized. Accordingly, a reliability of the display device DD may be improved.

The invention should not be construed as being limited to the embodiments set forth herein. Rather, these embodiments are provided so that this disclosure will be thorough and complete and will fully convey the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of providing a display device, the method comprising:
    providing a first active pattern of a first transistor, the first active pattern including a first oxide semiconductor material;
    providing a first preliminary gate insulating film on the first active pattern;
    providing an oxide semiconductor film including a second oxide semiconductor material different from the first oxide semiconductor material, on the first preliminary gate insulating film;
    providing a second preliminary gate insulating film on the oxide semiconductor film;
    providing a first gate insulating pattern from the second preliminary gate insulating film, by removing a portion of the second preliminary gate insulating film;
    wherein the removing of the portion of the second preliminary gate insulating film exposes the oxide semiconductor film from the first gate insulating pattern to define an exposed portion of the oxide semiconductor film;
    providing a second active pattern of a second transistor by removing the exposed portion of the oxide semiconductor film;
    providing a preliminary gate electrode film along each of the first preliminary gate insulating film, the first gate insulating pattern and the second active pattern;
    providing a first gate electrode of the first transistor which is on the first active pattern, and a second gate electrode of the second transistor which is on the second active pattern, by removing a portion of the preliminary gate electrode film; and
    providing from the first preliminary gate insulating film:
        a second gate insulating pattern which faces the first gate insulating pattern with the second active pattern therebetween, and
        a third gate insulating pattern between the first active pattern and the first gate electrode, by removing a portion of the first preliminary gate insulating film.

2. The method of claim 1, wherein the third gate insulating pattern directly contacts the first active pattern and the first gate electrode.

3. The method of claim 1, wherein the first gate insulating pattern is provided spaced apart from the first active pattern along the oxide semiconductor film.

4. The method of claim 1, wherein
    the providing of the first gate insulating pattern includes providing a first photoresist pattern corresponding to the second transistor, on the second preliminary gate insulating film; and
    the removing of the portion of the second preliminary gate insulating film includes etching the second preliminary gate insulating film by using the first photoresist pattern as a mask.

5. The method of claim 4, wherein the providing of the second active pattern includes etching of the oxide semiconductor film by using the first photoresist pattern together with the first gate insulating pattern as a mask.

6. The method of claim 5, wherein
    the etching of the second preliminary gate insulating film includes dry etching, and
    the etching of the oxide semiconductor film includes wet etching.

7. The method of claim 1, wherein
    the providing of the first gate electrode and the second gate electrode includes providing a second photoresist pattern corresponding to the first transistor and the second transistor, on the preliminary gate electrode film; and
    the removing of the portion of the preliminary gate electrode film includes etching the preliminary gate electrode film by using the second photoresist pattern as a mask.

8. The method of claim 7, wherein the providing of the second gate insulating pattern and the third gate insulating pattern includes etching the first preliminary gate insulating film by using the second photoresist pattern together with the first gate electrode, the second gate electrode, the first gate insulating pattern and the second active pattern as a mask.

9. The method of claim 8, wherein the etching of the first preliminary gate insulating film includes etching the first gate insulating pattern along with the first preliminary gate insulating film.

10. The method of claim 9, wherein the etching of the first gate insulating pattern along with the first preliminary gate insulating film exposes the second active pattern from the first gate insulating pattern.

11. The method of claim 1, wherein the second oxide semiconductor material includes tin.

12. The method of claim 11, wherein the second oxide semiconductor material includes tin oxide, indium-tin oxide, zinc-tin oxide, indium-zinc-tin oxide, tin-aluminum-zinc oxide, indium-gallium-tin oxide, or indium-tin-gallium-zinc oxide.

13. The method of claim 11, wherein the first oxide semiconductor material includes zinc oxide, gallium oxide, titanium oxide, indium oxide, indium-gallium oxide, indium-zinc oxide, gallium-zinc oxide, zinc-magnesium oxide, zinc-zirconium oxide, indium-gallium-zinc oxide, or indium-gallium-hafnium oxide.

* * * * *